United States Patent [19]

Sangyoji et al.

[11] Patent Number: 5,030,540
[45] Date of Patent: Jul. 9, 1991

[54] METHOD FOR FORMING IMAGE FORMING MEDIUM AND METHOD FOR CARRYING THE MEDIUM ON ARBITRARY IMAGE CARRYING MEDIUM

[75] Inventors: Kazuo Sangyoji, Nagoya; Shunichi Higashiyama, Yokkaichi, both of Japan

[73] Assignee: Brother Kogyo Kabushiki Kaisha, Japan

[21] Appl. No.: 504,879

[22] Filed: Apr. 5, 1990

[30] Foreign Application Priority Data

Apr. 6, 1989 [JP] Japan .................................. 1-87237

[51] Int. Cl.⁵ .......................... G03C 1/68; G03C 1/72
[52] U.S. Cl. .................................... 430/138; 430/199; 430/211; 430/253; 156/536; 156/580; 156/598; 156/DIG. 5; 156/DIG. 49; 427/147; 428/913; 428/914
[58] Field of Search ............... 430/138, 211, 199, 253; 156/536, 580, 598, DIG. 5, DIG. 49; 427/147; 428/913, 914

[56] References Cited

U.S. PATENT DOCUMENTS

| | | | |
|---|---|---|---|
| 2,996,104 | 8/1961 | Manro | 156/598 |
| 3,308,547 | 3/1967 | Tuppen, Jr. | 156/598 |
| 4,865,938 | 9/1989 | Sakai et al. | 430/138 |

FOREIGN PATENT DOCUMENTS

157141 6/1988 Japan .
270189 11/1988 Japan .
306435 12/1988 Japan .
2202641 9/1988 United Kingdom .

Primary Examiner—Charles L. Bowers, Jr.
Assistant Examiner—Patrick A. Doody
Attorney, Agent, or Firm—Oliff & Berridge

[57] ABSTRACT

A method of forming an image forming medium for a color image and a method of carrying the color image on an image carrying medium having an arbitrary surface condition such as a sheet type having a flat surface, a solid type having a three-dimensional surface or the like, using a photosensitive and pressure-sensitive recording medium carrying microcapsules and a developer sheet carrying developer material, comprising the steps of exposing the photosensitive and pressure-sensitive recording medium to an original image light to form a latent image on the photosensitive and pressure-sensitive recording medium, closely contacting the photosensitive and pressure-sensitive recording medium with the developer sheet while supplied with a pressure to thereby form a visible image on the developer sheet, separating the developer sheet from the photosensitive and pressure-sensitive recording medium, and attaching the developer sheet to one surface of a double-sided adhesive sheet having a separation sheet provided detachably to the other surface of the double-sided adhesive sheet, thereby forming an image forming medium. The separation sheet is detached from the image forming medium, and then is freely attached to the image carrying medium having the arbitrary surface condition.

9 Claims, 2 Drawing Sheets

METHOD FOR FORMING IMAGE FORMING MEDIUM AND METHOD FOR CARRYING THE MEDIUM ON ARBITRARY IMAGE CARRYING MEDIUM

BACKGROUND OF THE INVENTION

This invention relates to a method for forming an image forming medium (intermediate medium) and a method for carrying the intermediate medium on an arbitrary image carrying medium such as a card, plastic molded body and so on.

As disclosed in Japanese Unexamined Published Patent Application No. 58-17432, U.S. Pat. No. 4,399,209, U.S. Ser. No. 613,706 filed on May 23, 1984, U.S. Ser. No. 618,016 filed on June 7, 1984, U.S. Pat. No. 4,576,891, U.S. Pat. No. 4,600,678, U.S. Pat. No. 4,578,339, U.S. Ser. No. 659,151 filed on Oct. 9, 1984, U.S. Pat. No. 4,587,194, U.S. Ser. No. 755,400 filed on July 16, 1985 and U.S. Ser. No. 800,014 filed on Nov. 20, 1985, there has been conventionally known an image forming apparatus using a separate type of photosensitive and pressure-sensitive recording medium in which photosensitive microcapsules encapsulating mainly photo-curing resin, polymerization initiator and dye precursors, and developer material formed of a material capable of reacting with and coloring the dye precursors are coated on different sheets, respectively, to form a color image on the sheet (developer sheet) on which the developer material is carried.

Further, as disclosed in Japanese Unexamined Published Patent Application No. 58-45090 and U.S. Pat. No. 4,440,846, there has been also known an image forming apparatus using a self-contained type of photosensitive and pressure-sensitive recording medium in which both of the microcapsules and the developer material are carried on the same surface of a sheet and a color image is formed on the surface of the sheet, that is, on the photosensitive and pressure-sensitive recording medium.

In these image forming apparatus as described above, the color image can be formed on a specifically-manufactured medium such as a developer sheet as described above, but can not be formed on an arbitrary medium such as plain paper.

In order to overcome the above disadvantage, there has been proposed a recording medium which is beforehand formed of a base sheet, a developer material layer formed on one surface of the base sheet and a pressure-sensitive or heat-sensitive adhesive layer formed on the other surface of the base sheet before the recording medium and the photosensitive and pressure-sensitive recording medium are contacted with each other under pressure, as disclosed in Japanese Unexamined Published Patent Application No. 63-157141. Further, there has been proposed another recording medium (a seal type developer material sheet) having the structure that a base sheet having a developer material layer provided on one surface of the base sheet and an adhesible portion formed on the other surface of the base sheet is merely attached through the adhesible portion to a separation sheet into which silicon and so on are impregnated.

In the recording medium as disclosed in Japanese Unexamined Published Patent Application No. 63-157141, a color image can be formed on an image carrying medium such as a sheet type of support member, plain paper or the like by attaching the recording medium having the developer material thereon to the image carrying medium through the adhesive layer. However, it is difficult to attach the recording medium to a solid body having a three-dimensional surface through the adhesive layer because this recording medium requires a pressuring process or heat process to attach the recording medium to the image carrying medium. That is, this recording medium has a disadvantage that the color image ca not be formed on the three-dimensional surface of the body.

Further, in the recording medium as disclosed in Japanese Unexamined Published Patent Application No. 63-270189, the recording medium has a structure that the base sheet having the developer material layer and the adhesible portion at both of the obverse and reverse surfaces thereof is merely attached to the separation sheet. Therefore, when the recording medium (developer sheet) thus constructed is fed in a gap between pressure-developing rollers while contacted with the photosensitive and pressure-sensitive recording medium such as a microcapsule sheet under pressure and is subjected to a pressure development process with the rollers to form a visible image on the developer sheet, and/or when the developer sheet after the pressure development process is passed through a gap between heat-fixing rollers to heat-fix (glaze) the visible image on the developer sheet while the separation sheet is attached to the base sheet, there are possibilities that the pressure-developing rollers and the heat-fixing rollers skid on the developer sheet because the separation sheet comprises a silicon-imgrenated sheet having a lustrous and slippery surface, so that the developer sheet can not pass over the rollers and the surface of the developer sheet is wrinkled, and that the separation sheet is peeled away from the developer sheet during the pressure development and heat-fixing processes and thus the adhesible portion of the developer sheet is erroneously attached to the surfaces of the rollers.

SUMMARY OF THE INVENTION

An object of this invention is to provide a method for forming an image forming medium or an intermediate medium for a color image which can be easily and accurately passed over pressure-developing rollers and heat-fixing rollers, and a method for carrying the color image of the image forming medium (intermediate medium) on an image carrying medium having an arbitrary surface condition such as a sheet type having a flat surface, a solid type having a three-dimensional surface, an uneven type having an uneven surface and so on.

In order to attain the above object, according to one aspect of this invention, a method of forming an image forming medium for a color image using a photosensitive and pressure-sensitive recording medium carrying on one surface thereof microcapsules encapsulating mainly dye precursors, photo-curing resin and polymerization initiator and a developer sheet carrying on one surface thereof developer material capable of reacting with and coloring the dye precursors to form a visible image, comprises the steps of exposing the photosensitive and pressure-sensitive recording medium to light of an original image to form a latent image corresponding to the original image on the photosensitive and pressure-sensitive recording medium, applying a pressure to the photosensitive and pressure-sensitive recording medium and the developer sheet while closely contacting the microcapsule carrying surface of the photosensitive and pressure-sensitive recording medium with the developer material carrying surface of the developer sheet, thereby developing the latent image on the photosensitive and pressure-sensitive recording medium into a visible image on the developer sheet, separating the developer sheet having the visible image from the photosensitive and pressure-sensitive recording medium, and attaching the developer material carrying surface of the developer sheet to one surface of a double-sided adhesive sheet having a separation sheet provided detachably to the other surface of the double-sided adhesive sheet, thereby forming an image forming medium.

According to another aspect of this invention, the image forming medium obtained in the above method can be attached to the image carrying medium having the arbitrary surface condition by separating the separation sheet from the image forming medium, and attaching the image forming medium to the image carrying medium.

DETAILED DESCRIPTION OF THE INVENTION

The preferred embodiment of this invention will be described hereunder with reference to the accompanying drawings.

Figure 1:
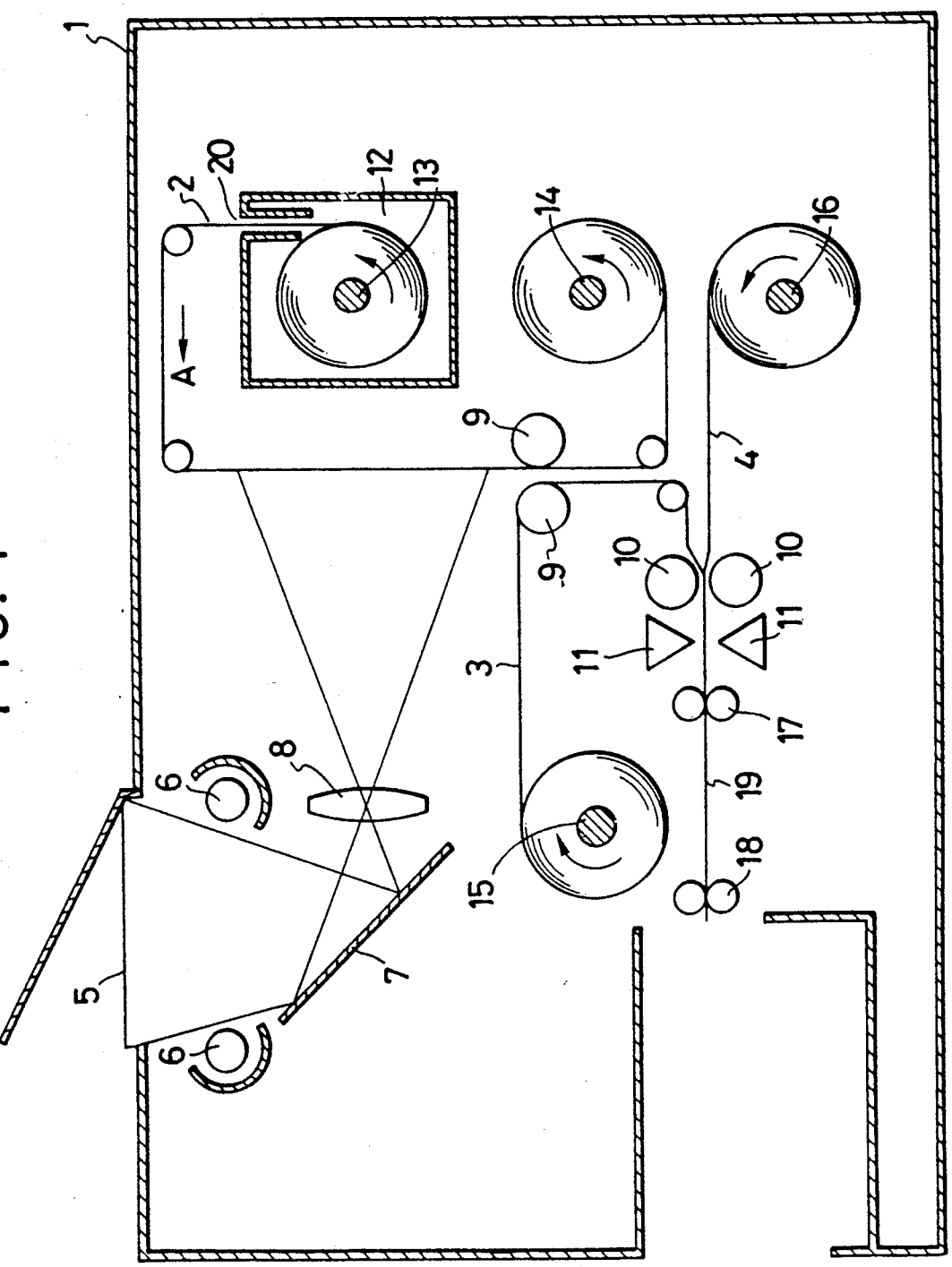
FIG. 1 is a cross-sectional view of an image forming apparatus according to this invention.

FIG. 1 is a cross-sectional view of an image forming apparatus adopting an image forming method according to this invention.

The image forming apparatus as shown in FIG. 1 has an outer frame. In the frame 1 is provided a first sheet supply roller 13 for accommodating a roll type of photosensitive and pressure-sensitive recording sheet carrying thereon micocapsules while winding the sheet therearound and a light-shielding cartridge 12 for mounting the first supply roller 13 therein and supplying the photosensitive and pressure-sensitive sheet through a sheet outlet 20 to an outside of the cartridge 12. The photosensitive and pressure-sensitive recording sheet 2 is wound around the first supply roller 13 such that the microcapsule coating surface of the sheet 2 is placed outwardly on the supply roller 13. The photosensitive and pressure-sensitive recording sheet 2 is drawn out of the supply roller 13, travels through the sheet outlet 20 along a sheet feed path in a direction as indicated by an arrow A, and taken up by a sheet take-up roller 14.

In the frame 1 is further provided an exposure unit for irradiating an image light of an original 5 to the photosensitive and pressure-sensitive recording sheet 2 traveling along the sheet feed path. The exposure unit comprises a light source 6 for exposing the original 5 to light, a mirror 7 for reflecting the light (image light) reflected from the original 5, an optical lens 8 for focusing the light from the mirror 7 on the photosensitive and pressure-sensitive recording sheet 2.

Below the exposure unit is provided a second sheet supply roller 15 for accommodating a developer sheet 3 while winding the developer sheet 3 therearound with the developer material coating surface of the developer sheet 3 being placed outwardly. The developer sheet 3 is drawn out of the second sheet supply roller 15 and then is closely contacted with the photosensitive and pressure-sensitive recording sheet 2 which has been exposed to the image light. The developer sheet 3 are fed in a gap between a pair of pressure-developing rollers 9 and supplied with a pressure by the rollers 9 while closely contacted with the photosensitive and pressure-sensitive recording sheet 2, so that the pressure development process is performed. After the pressure development process, the photosensitive and pressure-sensitive recording sheet 2 is separated from the developer sheet 3 and then taken up by the sheet take-up roller 14. On the other hand, the developer sheet 3 separated from the photosensitive and pressure-sensitive recording sheet 2 is fed to a pair of pressure rollers 10.

An adhesive sheet 4 is accommodated at a lower portion of the apparatus while wound around a third sheet supply roller 16 with a separation sheet of the adhesive sheet 4 being placed inwardly on the supply roller 16. The adhesive sheet 4 is drawn out of the supply roller 16 and then is fed to the pair of the pressure rollers 10 so that the developer sheet 3 and the adhesive sheet 4 are attached to each other under pressure to form a image sheet 19. Further, a cutter 11 for cutting the image sheet 19 at a predetermined length and plural sheet guiding rollers 17 and 18 are provided along a traveling path of the image sheet 19.

The constructions of the photosensitive and pressure-sensitive recording sheet 2, the developer sheet 3 and the adhesive sheet 4 will be described in detail.

Figure 2:
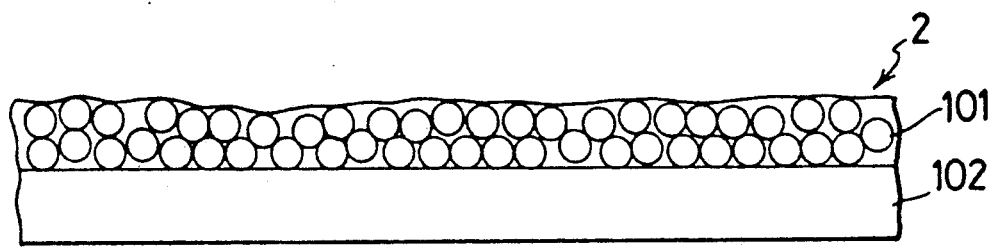
FIG. 2 is a cross-sectional view of a photosensitive and pressure sensitive recording medium of this invention.

FIG. 2 is a cross-sectional view of the photosensitive and pressure-sensitive recording sheet 2.

As disclosed in Japanese Unexamined Published Patent Application No. 58-17432, U.S. Pat. No. 4,399,209, U.S. Ser. No. 613,706 filed on May 23, 1984, U.S. Ser. No. 618,016 filed on June 7, 1984, U.S. Pat. No. 4,576,891, U.S. Pat. No. 4,600,678, U.S. Pat. No. 4,578,339, U.S. Ser. No. 659,151 filed on Oct. 9, 1984, U.S. Pat. No. 4,587,194, U.S. Ser. No. 755,400 filed on July 16, 1985 and U.S. Ser. No. 800,014 filed on Nov. 20, 1985, the photosensitive and pressure-sensitive recording sheet 2 comprises a base 102 coated thereon with microcapsules 101 encapsulating mainly photo-curing resin, polymerization initiator and dye precursor.

As a bulk portion of the dye precursor, there may be used lactone, lactam, sultone, spiropyran or a compound having ester or amide structure, such as triarylmethane compound, bisphenylmetane compound, xanthene compound, fluoran compound, thiazine compound, spiropyran compound, any compound similar to each of the above compounds or any combination thereof. As the photo-curing resin, there may be used ethylenically unsaturated acid ester of polyhydric alcohol such as ethylene glycol dimethacrylate, triethylene glycol dimethacrylate, trimethylolpropane triacrylate (TMPTA), trimethylopropane trimethacrylate, pentaerythritol triacrylate, pentaerythritol trimethacrylate, or the like. As the polymerization initiator, there may be used a diarylketone drivative such as benzophenone, Michler's ketone, benzoyl methyl ether, isopropylxanthone, isopropylthioxanthone or the like, benzoyl alkylether, ketocoumarin compound or the like.

Each of the microcapsules 101 is produced by encapsulating the above dye precursor, photo-curing resin, polymerization initiator, etc. into a capsule wall which is formed of urea-formaldehyde polymer, melamine-formaldehyde polymer, methylolmelamine-formaldehyde polymer or the like by a well-known coacervation method or an interfacial polymerization method. The microcapsules 101 thus formed are suitably mixed with a bulking agent (filler) and a viscosity adjusting agent and then are coated on a support member 102 to form a photosensitive and pressure-sensitive recording sheet 2. Any kind of material be used for the base 102. Preferably, the base 102 comprises any one of paper, plastic film polyvinyl chloride, polyvinylidene choloride, polyethylene, polypropylene, polyethylene terephthalate or the like), gelatin film, cellulose film and so on. Polyethylene terephthalate film which has a high mechanical strength is more preferably used.

Figure 3:
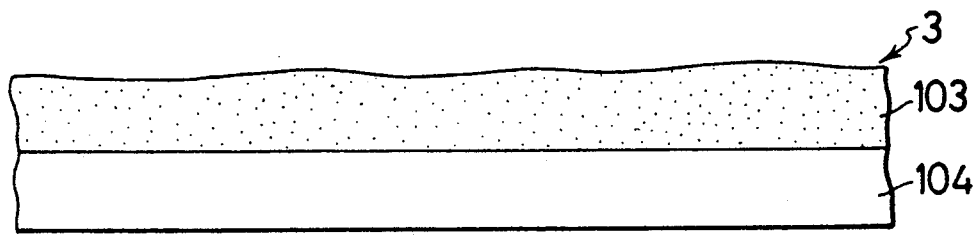
FIG. 3 is a cross-sectional view of a developer sheet of this invention.

FIG. 3 is a cross-sectional view of the developer sheet 3.

The developer sheet comprises a base 104 carrying the developer material 103 thereon. Any kind of material may be used for the base 104 insofar as it has a light-transmissible property. For example, paper, plastic film (polyvinyl chloride, polyvinylidene chloride, polyethylene, polypropylene, polyethylene terephthalate or the like), gelatin film, cellulose film or the like may be preferably used for the base 104. Polyethylene terephthalate which has a high mechanical strength and an excellent light-transmissible property is more preferably used.

As the developer material 103, there may be used an organic acid such as tannic acid, gallic acid, propyl gallic acid ester, or the like, ester, phenol-formaldehyde resin, phenol acetylene condensation polymerization resin, or a metal salt of acid polymer, aromatic carboxylic an acid or the like. A metal salt of an aromatic salicylic acid group as disclosed in Japanese Unexamined Published Patent Application Nos. 61-100493, 62-208985, 63-34179, and 63-173680 may be also used as the developer material. In this embodiment, the developer material 103 is mixed with a binder and then these mixed materials are coated on the base 104. The binder is used for allowing the developer material 103 to adhere to the base 104, and its material is selected in accordance with the materials constituting the support member 104 and the developer material. In general, polyvinyl acetate, copolymer of ethylene and vinyl acetate, polyviny alcohol or cellulose may be used for the binder.

Figure 4:
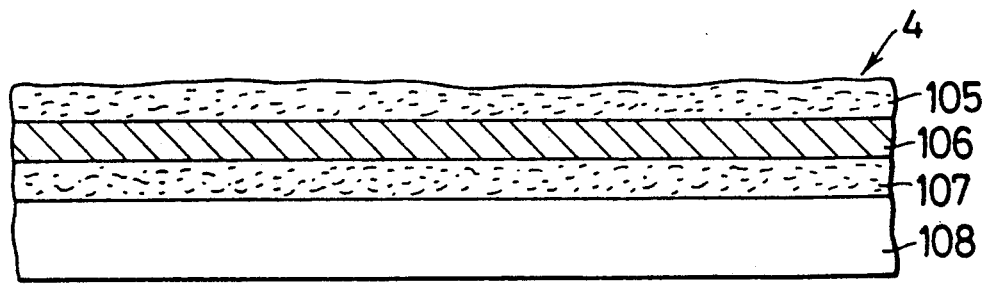
FIG. 4 is a cross-sectional view of an adhesive sheet of this invention.

FIG. 4 is a cross-sectional view of the adhesive sheet 4.

The adhesive sheet as shown in FIG. 4 comprises a base 106, adhesives 105 and 107 carried on both surfaces of the base 106, and a separation sheet 108 attached to one of the adhesives 105 and 107.

As the base 106, there may be used paper, plastic film (polyviny chloride, polyvinylidene chloride, polyethylene, polypropylene, polyethylene terephthalate or the like), gelatin film, cellulose film or the like. The adhesives 105 and 106 may be identical to or different from each other. For example, rubber group, acryl group, vinyl group, silicon group or other groups may be used for the adhesives 105 and 107. Further, the separation sheet 108 may be formed of paper or plastic sheet coated with or impregnated therein with a separation agent such as silicon group, polyethylene group, polypropylene group or fluorine group.

The operation of the image forming apparatus as shown in FIG. 1 utilizing the photosensitive and pressure-sensitive recording sheet, the developer sheet and the adhesive sheet as described above will be described hereafter.

A light emitted from the light source 6 is reflected from the original 5, and then is further reflected from the mirror 7 to the optical lens 8. The light entering the optical lens is focused on the microcapsule coating surface of the photosensitive and pressure-sensitive recording sheet 2 which is fed to an exposure region where a latent image corresponding to an original image is formed on the photosensitive and pressure-sensitive recording sheet 2. The photosensitive and pressure-sensitive recording sheet 2 having the latent image thereon is fed in the direction as indicated by an arrow A to a gap between the pressure rollers 9 by a driving device (not shown) while superposed on the developer material coating surface of the developer sheet 3 which has been drawn out of the second sheet supply roller 15, and then is subjected to a pressure development process under pressure by the pressure rollers 9.

In the pressure development process, those microcapsules which have not been exposed to light are ruptured to issue the dye precursors encapsulated therein. The issued dye precursors are reacted with the developer material 103 on the developer sheet 3 to be colored, so that the latent image on the photosensitive and pressure-sensitive recording sheet 2 is developed into a visible image on the developer sheet 3.

The developer sheet 3 having the visible image thereon is separated from the photosensitive and pressure-sensitive recording sheet 2, and then the developer material coating surface 103 of the developer sheet 3 on which the developer material is carried is superposed on the adhesive 105 of the adhesive sheet 4 which has been drawn out of the third sheet supply roller 16. The superposed sheets are fed to a gap between the pressure rollers 10 and contacted with each other under pressure by the pressure rollers 10, so that these sheets are closely attached to each other to thereby form the image sheet 19. The image sheet 19 is cut at a predetermined size by the cutter 11, and then discharged through the feeding rollers 17 and 18 to the outside of the apparatus.

In a practical use for the image sheet 19 thus formed, an user exfoliates the separation sheet 108 from the image sheet 19, and attaches the image sheet 19 to an arbitrary image carrying medium on which the visible image is required to be finally carried. In this invention, the image sheet 19 can be attached to any type of image carrying medium having any shape, surface condition and other characteristics such as a card, a plastic molded body, the cover of a book or the like.

This invention is not limited to the above embodiment For example, the pair of pressure rollers 10 and the material of the adhesive 105 may be substituted for a pair of heat-pressure rollers and a thermoplastic resin adhesive, respectively.

Further, in place of use of a reflected light from the original for the exposure process, a light transmitted through the original may be used for the exposure process. Still further, in place of a direct exposure process in which an original image light reflected from or transmitted through the original is directly exposed to the photosensitive and pressure-sensitive recording sheet, an indirect exposure process may be used in which light transmitted through a liquid crystal device controlled by electrical signals corresponding to an original image is exposed to the photosensitive and pressure-sensitive recording sheet, or light irradiated from a cathode ray tube (CRT) or a light emitting diode (LED) array which is controlled by electrical signals corresponding to the original image is exposed to the photosensitive and pressure-sensitive recording sheet.

As described above, according to this invention, any type of image recording sheet such as a plastic molded body, the cover of a book or the like which has a three dimensional surface or an uneven surface may be used for carrying a visible image thereon. Further, when the image sheet is attached to the image recording sheet, the developer material itself on the image sheet is prevented from being exposed to an outside because the light-transmissible (transparent) base 104 is provided between the developer material and the outside. Therefore, the visible image on the developer sheet can be prevented from being damaged by the outside, and weather and light resistance can be improved.

What is claimed is:

1. A method of forming an image forming medium for a color image using a photosensitive and pressure-sensitive recording medium carrying on one surface thereof microcapsules encapsulating dye precursors and a developer sheet carrying on one surface thereof developer material capable of reacting with and coloring the dye precursors to form a visible image, the microcapsules of the photosensitive and pressure-sensitive recording medium having a mechanical strength variable in accordance with intensity of light incident thereto, comprising the steps of:

exposing the photosensitive and pressure-sensitive recording medium to light of an original image to form a latent image corresponding to the original image on the photosensitive and pressure-sensitive recording medium;

superposing the photosensitive and pressure-sensitive recording medium having the latent image on the developer sheet such that the microcapsule carrying surface of the photosensitive and pressure-sensitive recording medium is closely contacted with the developer material carrying surface of the developer sheet, and applying a pressure to the superposed photosensitive and pressure-sensitive recording medium and the developer sheet to develop the latent image on the photosensitive and pressure-sensitive recording medium into a visible image on the developer sheet;

separating the developer sheet having the visible image from the photosensitive and pressure-sensitive recording medium; and attaching the developer sheet having the visible image thereon to one surface of a double-sided adhesive sheet having a separation sheet provided detachably to the other surface of the double-sided adhesive sheet, thereby carrying an image forming medium.

2. A method as claimed in claim 1, further comprising a step of cutting the image carrying medium to a predetermined size.

3. A method as claimed in claim 1, wherein the adhesive layer comprises a base and adhesives coated on both sides of the base.

4. A method as claimed in claim 3, wherein the base comprises any material selected from the group consisting of paper, polyviny chloride film, polyvinylidene chloride film, polyethylene film, polypropylene film, polyethylene terephthalate film, gelatin film, cellulose film, and each of the adhesives comprises any material selected from the group consisting of rubber group, acryl group, vinyl group and silicon group.

5. A method as claimed in claim 1, wherein the separation sheet is formed of any one of paper and plastic sheet provided with any material selected from the group consisting of silicon group, polyethylene group, polypropylene group and fluorine group.

6. A method for forming a color image on an image carrying medium having an arbitrary surface condition using a photosensitive and pressure-sensitive recording medium carrying on one surface thereof microcapsules encapsulating mainly dye precursors, photo-curing resin and polymerization initiator and a developer sheet carrying on one surface thereof developer material capable of reacting with and coloring the dye precursors to form a visible image, comprising the steps of:

exposing the photosensitive and pressure-sensitive recording medium to light of an original image to form a latent image corresponding to the original image on the photosensitive and pressure-sensitive recording medium;

superposing the photosensitive and pressure-sensitive recording medium having the latent image on the developer sheet such that the microcapsule carrying surface of the photosensitive and pressure-sensitive recording medium is closely contacted with the developer material carrying surface of the developer sheet, and applying a pressure to the superposed photosensitive and pressure-sensitive recording medium and the developer sheet to develop the latent image on the photosensitive and pressure-sensitive recording medium into a visible image on the developer sheet;

separating the developer sheet having the visible image from the photosensitive and pressure-sensitive recording medium;

attaching the developer material carrying surface of the developer sheet to one surface of a double-sided adhesive sheet having a separation sheet provided detachably to the other surface of the double-sided adhesive sheet, thereby forming an image carrying medium;

detaching the separation sheet from the image carrying medium; and attaching the image carrying medium to an image carrying member with the adhesive sheet.

7. A method as claimed in claim 6, wherein the image carrying member is of any one type of a sheet type having a flat surface, a solid type having a three-dimensional surface and an uneven type having an uneven surface.

8. A method of forming an image forming medium for a color image using a photosensitive and pressure-sensitive recording medium carrying on one surface thereof microcapsules encapsulating dye precursors and a developer sheet comprising a light-transmissible base and developer material coated on the base, the developer material being capable of reacting with and coloring the dye precursors to form a visible image and the microcapsules of the photosensitive and pressure-sensitive recording medium having a mechanical strength variable in accordance with intensity of light incident thereto, comprising the steps of:

exposing the photosensitive and pressure-sensitive recording medium to light of an original image to form a latent image corresponding to the original image on the photosensitive and pressure-sensitive recording medium;

applying a pressure to the photosensitive and pressure-sensitive recording medium while being closely superposed on the light-transmissible developer sheet to develop the latent image on the photosensitive and pressure-sensitive recording medium into a visible image on the developer sheet;

separating the developer sheet having the visible image from the photosensitive and pressure-sensitive recording medium; and attaching the developer material of the developer sheet to one surface of a double-sided adhesive sheet having a separation sheet provided detachably to the other surface of the double-sided adhesive sheet, thereby forming an image carrying medium.

9. A method for forming a color image on a desired image carrying medium having an arbitrary surface condition using a photosensitive and pressure-sensitive recording medium carrying on one surface thereof microcapsules encapsulating mainly dye precursors and a developer sheet comprising a light-transmissible base and developer material coated on the base, the developer material being capable of reacting with and coloring the dye precursors to form a visible image and the microcapsules of the photosensitive and pressure-sensitive recording medium having a mechanical strength variable in accordance with intensity of light incident thereto, comprising the steps of:

exposing the photosensitive and pressure-sensitive recording medium to light of an original image to form a latent image corresponding to the original image on the photosensitive and pressure-sensitive recording medium;

applying a pressure to the photosensitive and pressure-sensitive recording medium while being closely superposed on the light-transmissible developer sheet to develop the latent image on the photosensitive and pressure-sensitive recording medium into a visible image on the developer sheet;

separating the developer sheet having the visible image from the photosensitive and pressure-sensitive recording medium;

attaching the developer material of the developer sheet to one surface of a double-sided adhesive sheet having a separation sheet provided detachably to the other surface of the double-sided adhesive sheet, thereby forming an image carrying medium;

detaching the separation sheet from the image forming medium; and attaching the image forming medium to the image carrying medium through the adhesive sheet.

* * * * *